United States Patent [19]

Hieber et al.

[11] 4,351,695

[45] Sep. 28, 1982

[54] METHOD OF PRODUCING LOW-RESISTANT, MONOCRYSTALLINE METALLIC LAYERS BY IMPLANTING IONS INTO A POLYCRYSTALLINE METAL LAYER AND HEATING TO PRODUCE A MONOCRYSTALLINE LAYER

[75] Inventors: Konrad Hieber; Norbert Mayer, both of Munich, Fed. Rep. of Germany

[73] Assignee: Siemens Aktiengesellschaft, Berlin & Munich, Fed. Rep. of Germany

[21] Appl. No.: 222,019

[22] Filed: Jan. 2, 1981

[30] Foreign Application Priority Data

Jan. 30, 1980 [DE] Fed. Rep. of Germany ....... 3003285

[51] Int. Cl.³ .................... C30B 1/02; C30B 29/02; H01L 21/283
[52] U.S. Cl. .................... 156/603; 427/38; 427/88; 427/91; 427/124; 427/250
[58] Field of Search ............ 427/38, 53.1, 88, 91, 427/124, 250; 351/91; 156/603, 605

[56] References Cited

U.S. PATENT DOCUMENTS

| 3,585,088 | 6/1971 | Schwuttke et al. | 156/603 |
| 4,214,918 | 7/1980 | Gat et al. | 427/53.1 |
| 4,258,078 | 3/1981 | Celler | 427/53.1 |

FOREIGN PATENT DOCUMENTS

| 10971 | 5/1980 | European Pat. Off. | 427/38 |
| 2727659 | 4/1979 | Fed. Rep. of Germany . | |
| 50-32195 | 10/1975 | Japan | 357/91 |
| 1258259 | 12/1971 | United Kingdom | 427/38 |

OTHER PUBLICATIONS

O'Connell, "Formation of Resistive Films by Ion Bombardment" Colloquium on Ion Implantation, London, England, Jan. 1970.
Dudonis et al., "Influence of Ion Bombardment on the Properties of Vacuum Evaporated Thin Films", Thin Solid Films, 36, No. 1, pp. 117–120, 1976.
D. R. Denison et al., Technical Report No. 79.02 Perkin-Elmer Ultek Division, Apr. 1979, pp. 1–8.
F. d'Heurle et al., Applied Physics Letters, vol. 16, Jan. 1970, pp. 80–81.

*Primary Examiner*—John D. Smith
*Attorney, Agent, or Firm*—Hill, Van Santen, Steadman, Chiara & Simpson

[57] ABSTRACT

Monocrystalline metal layers having a low specific electrical resistance ($\rho < 15\mu\Omega$ cm) are produced by depositing a layer of a select metal or alloy in its polycrystalline state onto a substrate useful in semiconductor and thin film technologies, such as composed of glass, ceramic or silicon; substantially simultaneously with the deposition or thereafter, implanting ions which are inert relative to the metal or alloy so as to generate crystal lattice disruptions in the deposited layer and thereafter heating the so-coated substrate so as to convert the polycrystalline layer into its monocrystalline state. The principles of the invention are particularly applicable for the production of lead structures in micro-electronics.

12 Claims, 1 Drawing Figure

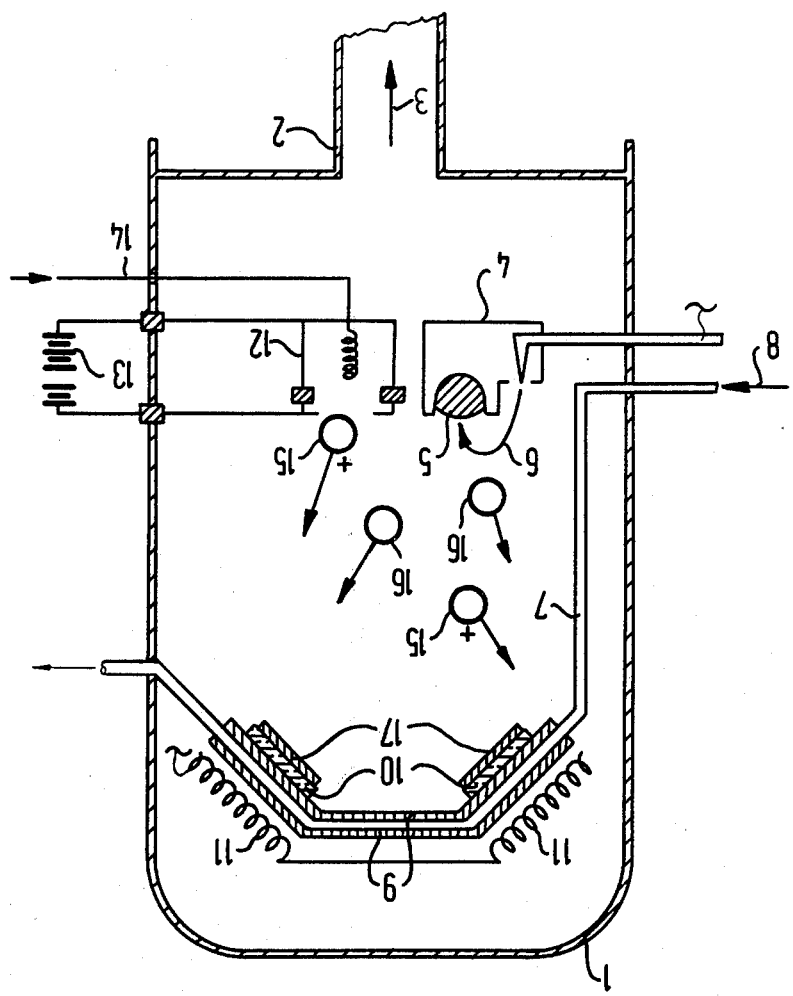

4,351,695

METHOD OF PRODUCING LOW-RESISTANT, MONOCRYSTALLINE METALLIC LAYERS BY IMPLANTING IONS INTO A POLYCRYSTALLINE METAL LAYER AND HEATING TO PRODUCE A MONOCRYSTALLINE LAYER

BACKGROUND OF THE INVENTION

1. Field of the Invention

The present invention relates to a method of producing low-resistant monocrystalline metal layers on substrates, such as are utilized in semiconductor and thin film technologies.

2. Prior Art

Metal or alloy layers (i.e., metallic layers) on substrates composed of ceramic, glass or silicon are frequently utilized in electro-technology. Such relatively thin metallic layers, for example, function as lead or conductor structures, electrical resistance or capacitors in semiconductor or thin film technologies.

Continuing miniaturization in semiconductor and thin film technology is accompanied by a reduction of the cross-section of lead or conductor structures. Accordingly, the height to width ratio of the lead structure becomes significantly greater as the heat dissipation across the substrate becomes poorer, i.e., the lead structure is subjected to a higher thermal load. Because the current strength cannot be reduced proportionally to the lead cross-section, it must be able to withstand current densities of $1 \times 10^6$ through $1 \times 10^8$ A/cm$^2$. Both higher thermal loads as well as higher current densities accelerate the failure of leads due to electro-migration. A primary cause of electro-migration appears to result from material inhomogeneities, for example, at crystal boundaries.

As utilized herein and in the claims, the term "monocrystalline" is utilized to designate structures wherein the mean grain diameter, k, is significantly greater than the layer thickness, d, (typically, $k \geq 100 \times d$), but at least achieves the size of, for example, a transistor in a system (with k being approximately equal to 50 $\mu$m).

Heretofore, problems of electromigrations were solved by the use of low-resistant materials ($\rho < 15$ $\mu\Omega$ cm) and current densities up to a maximum of about $5 \times 10^5$ A/cm$^2$. Since the effect of electromigration is greatest when k (mean grain diameter) approximately corresponds to the width of the leads, two possibilities were available:

1. Production of fine-crystalline materials. A stable, amorphous material would be ideal, but this would hardly be useful because of the high specific electrical resistance which necessarily follows. For this reason, a compromise was undertaken in which, for example, aluminum was alloyed with 1.2 through 2% silicon and/or a maximum of 4% copper. This relatively small number of foreign atoms increased the specific electrical resistance only slightly; in comparison to pure aluminum, the foreign atoms stabilized the structure of the lead material so that, in the final analysis, an improvement of the long-term behaviour resulted (for further details see D. R. Denison et al, Technical Report, No. 79.02, Perkin Elmer, Ultek Division, pages 1–8, April, 1979.)

2. Production of monocrystalline layers. Investigations by d'Heurle et al (Applied Physics Letters, Vol. 16, pages 80–81, January 1970) have shown that monocrystalline aluminum would meet all future demands in terms of its long-term stability and resistance to electromigration. However, a problem exists in that the production of such monocrystalline aluminum layers has heretofore only been possible on monocrystalline substrates at temperatures above 350° C.

A method by which monocrystal layers can be obtained without temperatures above 350° C. being necessary, is known from German Offenlegungsschrift 27 27 659. In accordance with this technique, stable layer properties are achieved by depositing metal layers, preferably composed of tantalum, on a substrate in an amorphous or greatly disrupted state at a low substrate temperature, for example, at $-190°$ C. and, subsequently comparatively slightly heating the substrate to cause the deposited metal layer to crystallize. In this manner, coherent lattice areas of less than 4 nm are enlarged into crystals having a grain diameter of at least 70 $\mu$m by heating the substrate above about $-90°$ C. Such layers retain their relevant properties even at much higher temperatures (higher than 400° C.), although they were not exposed to any temperature higher than $-90°$ C. during their production process. This method can be utilized in semiconductor and thin film technologies but, up to now, has only yielded layers with $k \approx 100 \times d$, with tantalum, tantalum-cobalt and tungsten-copper. After crystallization, the specific electrical resistance of these layers is still above 15 $\mu\Omega$ cm.

SUMMARY OF THE INVENTION

The present invention provides a process of producing low-resistant ($\rho < 15$ $\mu\Omega$ cm) monocrystalline metal or alloy layers wherein no temperature above 350° C. are required during the production of monocrystalline leads.

In accordance with the principles of the invention, low resistant monocrystal layers with $k > 100 \times d$ are produced by first depositing or precipitating a polycrystalline layer of a select metal or alloy on a substrate, and simultaneously therewith or directly thereafter, implanting ions which are inert to the metal or alloy so as to generate crystal lattice disruptions in the deposited layer and thereafter heating the substrate so as to convert the resultant greatly disrupted polycrystalline layer into its monocrystalline state.

A greatly disrupted initial state of a crystal lattice, which is necessary for producing monocrystalline layers, is achieved in a material existing in a polycrystalline initial state by ion bombardment. It is important that the implanted ions do not react, i.e., are relatively inert, with the host metal or alloy when the coated substrate is heated up to a temperature in the range of about room temperature (about 20° C.) up to a maximum of 350° C.

In certain embodiments of the invention, the ion bombardment or implantation step can be coupled with a substrate cooling step, wherein the substrate is cooled preferably to a temperature below about $-90°$ C., when metals or alloys are utilized whose lattice imperfections are easily cured (for example, aluminum, copper, molybdenum, gold, nickel, etc). However, substrate cooling is generally not required with most alloys. Accordingly, in order to attain the advantages of the invention, one need only to select a metal which is capable of existing as a monocrystalline and has a specific electrical resistance of $<15$ $\mu\Omega$ cm.

In accordance with the principles of the invention, the monocrystalline lead material can be selected from the group consisting of aluminum, copper, molybdenum, silver, copper-nickel, aluminum-copper with 1 through 20 atomic % aluminum, silver-gold, silver-palladium, gold-copper, gold-palladium and copper-molybdenum.

In accordance with the principles of the invention, inert gas atoms, such as nitrogen, hydrogen, argon or helium, are utilized as the implantation ions. Inert gas atoms such as argon or helium atoms are preferably utilized during the production of tantalum and/or aluminum/copper layers and nitrogen atoms are preferably utilized during the production of chromium layers.

BRIEF DESCRIPTION OF THE DRAWING

The FIGURE is an elevated schematic view of an apparatus system useful in the practice of the principles of the invention.

DESCRIPTION OF PREFERRED EMBODIMENTS

The invention provides a method of producing low-resistant ($\rho < 15$ $\mu\Omega$ cm) monocrystalline metal layers on substrates, as are particularly useful in semiconductor and thin film technology wherein no temperature above 350° C. are required during the production of the monocrystalline layers.

In accordance with the principles of the invention, a polycrystalline layer of a select metal or alloy is deposited onto a substrate, such as composed of a glass, ceramic or silicon and which, in certain embodiments, can be maintained at temperatures below about $-90°$ C. during the deposition of the polycrystalline metal layer; with crystal lattice disruptions being generated in the so-deposited metal layer by implanting ions which are inert relative to the metal material and thereafter converting the resultant greatly disrupted polycrystalline metal layer into its monocrystalline state by heating the substrate, preferably to a temperature in the range of about room temperature up to a maximum of about 350° C.

In certain embodiments of the invention, the deposition of the polycrystalline metal layer and the implantation of ions can occur substantially simultaneously whereas in other embodiments of the invention, the implantation of the ions can occur after the deposition of the polycrystalline metal layer.

Referring now to the drawing, an apparatus system is illustrated wherein a vaporization system is, in accordance with the principles of the invention, combined with an ion implantation system. An electron beam vaporization source 4 is positioned in a vacuum chamber defined by housing 1, which in turn is connected to a high vacuum pump (schematically indicated by arrow 3) via a conduit 2. A metal source 5, which in exemplary embodiment was composed of an aluminum-copper alloy, is positioned within the electron beam vaporization source 4. This metal source is vaporized or evaporated by an electron beam 6 at a pressure of, for example, $10^6$ N/m². A heat exchange means 7 connected with a source (not shown) of a cooling agent, for example, liquid hydrogen or nitrogen, is operationally positioned within the vacuum housing 1 so that a heat exchange circuit 8 is established within the vacuum chamber. A substrate holder 9 is operationally associated with the heat exchange means 7. Substrates 10, intended for coating and which are composed, for example, of ceramic, glass or silicon, are attached to the substrate holder 9 in such a manner as to have a surface thereof exposed to the electron beam vaporization source 4. Further, an electrical resistance heating coil means 11 is operationally associated with the substrates 10 so that these substrates can be controllably heated up to temperatures of a maximum of about 350° C.

An ion gun means 12, connected to a high voltage source 13 is also positioned in the chamber of the vacuum housing 1 in the area of the electron beam vaporizer 4. A gas inlet 14 for the inert gas composed of the ions to be implanted, is positioned in the area of the ion gun means 12. With an aluminum-copper metal source (aluminum content 6–12 atomic percent), the inert gas preferably is composed of argon. Similarly, with a chromium metal source, the inert gas is composed of nitrogen whereas with a tantalum metal source, the inert gas is composed of argon. Further, with an aluminum/copper metal source, the inert gas can also be helium.

In the illustration, the generated inert gas ions are designated with reference numbers 15 whereas the metal atoms simultaneously proceeding from the electron beam vaporizer 4 are designated with reference numerals 16. In embodiments wherein the implantation of the inert gas ions occurs substantially simultaneously during the deposition of a polycrystalline metal layer, an implantation energy level of about 5 keV through 70 keV and at a dose of about $10^{13}$ to $10^{16}$ ion cm$^{-2}$ sec$^{-1}$ is utilized, depending upon the selection of the metal or alloy. When a final layer thickness of, for example, about 3 $\mu$m is desired, the metal deposition rate is controlled so as to range between about 0.5 nm through 5 nm/sec.

However, in accordance with the principles of the invention, the implantation of the inert atoms into the polycrystalline layer can occur after the deposition process is complete. In such embodiments, implantation of ions occurs at an energy level of about 1 through 5 MeV and at an implantation dose of about $10^{16}$ through $10^{19}$ cm² sec$^{-1}$.

Subsequent to the deposition process (preferably at a deposition rate of about 1 nm/sec), which can also be carried out on a substrate 10 cooled by the heat exchange means 7 down to about $-190°$ C., the substrate 10, after the electron beam vaporizer 4 and the ion implantation means 12 have been shut-down, is heated by the resistance heating coil means 11 up to a temperature of about 150° C., during which the deposited layer 17, which was greatly disrupted in terms of its lattice structure due to the implantation of ions (with the layer 17 being on an amorphous substrate 10) is converted into its monocrystalline state. In this manner, the mean grain diameter, k, achieved is significantly greater than the layer thickness d ($k \approx 200 \times d$).

The specific electrical resistance of the exemplary aluminum/copper layers produced in the above-described manner in a layer thickness of 3 $\mu$m ranges from about 8 through 12 $\mu\Omega$ cm (i.e., $\rho < 15$ $\mu\Omega$ cm).

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A method of producing monocrystalline metal layers having a low specific electrical resistance on substrates as are particularly useful in semiconductor and thin film technologies, comprising:
   depositing a polycrystalline layer of a select metal onto a substrate;
   implanting ions into such layer which are relatively inert to said metal so as to generate crystal lattice disruption in said metal layer; and
   heating said substrate to a temperature in the range of about room temperature up to a maximum of about 350° C. so as to convert the resultant greatly disrupted polycrystalline metal layer into its monocrystalline state with a mean grain diameter greater than 100 times the layer thickness.

2. A method as defined in claim 1 wherein said deposition of the polycrystalline metal layer and said implantation of ions occurs substantially simultaneously.

3. A method as defined in claim 1 wherein said implantation of ions occurs subsequent to said deposition of the polycrystalline metal layer.

4. A method as defined in claim 1 wherein said substrate is maintained at a temperature below about $-90°$ C. during deposition of said polycrystalline metal layer.

5. A method as defined in claim 1 wherein said implantation ions are composed of atoms selected from the group consisting of nitrogen, hydrogen and inert gas atoms.

6. A method as defined in claim 1 wherein said select metal material is chromium and said implantation ions are composed of nitrogen atoms.

7. A method as defined in claim 1 wherein said select metal is tantalum and said implantation ions are composed of argon atoms.

8. A method as defined in claim 1 wherein said select metal is an aluminum/copper alloy and said implantation ions are composed of atoms selected from the group consisting of argon and helium.

9. A method as defined in claim 1 wherein said deposition of the polycrystalline metal layer occurs with the aid of an electron beam vaporization means.

10. A method as defined in claim 1 wherein said deposition of the polycrystalline metal layer occurs via vapor deposition with a controlled vaporization rate set at about 0.5 nm through 5 nm and the deposited layer thickness is controlled to attain a thickness of about 3 $\mu$m.

11. A method as defined in claim 1 wherein said implantation of ions occurs at an energy level of about 5 keV through 70 keV and at a dose of about $10^{13}$ to $10^{16}$ ions $cm^{-2} sec^{-1}$, when said implantation occurs substantially simultaneously with the deposition of the polycrystalline metal layer.

12. A method as defined in claim 1 wherein said implantation of ions occurs at an energy level of about 1 through 5 MeV and at a dose of about $10^{16}$ through $10^{19}$ $cm^{-2} sec^{-1}$, when said implantation occurs subsequent to the deposition of the polycrystalline metal layer.

* * * * *